(12) United States Patent
Morico et al.

(10) Patent No.: US 10,219,375 B2
(45) Date of Patent: Feb. 26, 2019

(54) HYBRID CIRCUIT ASSEMBLY

(71) Applicant: RAYTHEON COMPANY, Waltham, MA (US)

(72) Inventors: Peter D. Morico, Sudbury, MA (US); John D. Walker, Sudbury, MA (US)

(73) Assignee: RAYTHEON COMPANY, Waltham, MA (US)

( * ) Notice: Subject to any disclaimer, the term of this patent is extended or adjusted under 35 U.S.C. 154(b) by 301 days.

(21) Appl. No.: 15/296,198

(22) Filed: Oct. 18, 2016

(65) Prior Publication Data

US 2017/0042027 A1 Feb. 9, 2017

Related U.S. Application Data

(62) Division of application No. 14/016,806, filed on Sep. 3, 2013, now Pat. No. 9,504,157.

(51) Int. Cl.
| | |
|---|---|
| *H05K 1/14* | (2006.01) |
| *H05K 3/32* | (2006.01) |
| *H05K 3/36* | (2006.01) |
| *H05K 1/02* | (2006.01) |

(52) U.S. Cl.
CPC .......... *H05K 1/142* (2013.01); *H05K 1/0209* (2013.01); *H05K 3/32* (2013.01); *H05K 3/36* (2013.01); *H05K 2201/066* (2013.01); *Y10T 29/49126* (2015.01)

(58) Field of Classification Search
CPC .... Y10T 29/49126; H05K 1/14; H05K 1/141; H05K 1/142; H05K 1/145; H05K 3/36; H05K 3/4611; H05K 3/4685; H05K 3/4694; H05K 2203/061
See application file for complete search history.

(56) References Cited

U.S. PATENT DOCUMENTS

| | | |
|---|---|---|
| 4,109,298 A | 8/1978 | Hanni et al. |
| 5,488,256 A | 1/1996 | Tsunoda |
| 6,388,889 B1 | 5/2002 | Oka |
| 7,982,302 B2 | 7/2011 | Beckedahl et al. |
| 2005/0231925 A1 | 10/2005 | Fukuda |
| 2008/0123312 A1 | 5/2008 | Cheng et al. |
| 2009/0161319 A1 | 6/2009 | Ingenbleek |
| 2010/0328920 A1* | 12/2010 | Nikaido ................. H05K 1/142 361/803 |

* cited by examiner

*Primary Examiner* — Peter DungBa Vo
*Assistant Examiner* — Joshua D Anderson
(74) *Attorney, Agent, or Firm* — Cantor Colburn LLP

(57) ABSTRACT

A hybrid circuit assembly includes an integrated metal substrate (IMS) having high-voltage, high-power components mounted thereon. The IMS includes a metal base plate an insulating adhesive on the metal base plate, and one or more wiring layers on the insulating adhesive. The hybrid circuit assembly includes a multi-layer printed wiring board (PWB) having low-voltage, low-power components mounted thereon. The multi-layer PWB is connected to the IMS and has an upper surface that is co-planar with an upper surface of the IMS. The PWB is mounted on the metal base plate via the insulating adhesive.

5 Claims, 3 Drawing Sheets

2

HYBRID CIRCUIT ASSEMBLY

DOMESTIC PRIORITY

This application is a divisional of U.S. patent application Ser. No. 14/016,806, filed Sep. 3, 2013, the disclosure of which is incorporated by reference herein in its entirety.

BACKGROUND

The present disclosure relates to a printed circuit assembly and, in particular, to a printed circuit board having two or more different types of boards arranged in a co-planar manner.

Many direct current to direct current (DC/DC) converters require a highly thermally conductive printed wiring board for power-handling and high power dissipating components. The power-handling components require very low electrical resistance to minimize power losses and low thermal resistance to minimize increases in the device temperature. Whereas the power components require thick low-electrical-resistance conductors for mounting and interconnection, low-voltage components, such as control and data communications circuitry, require thin conductors and high densities of interconnections among circuit components. Thus, there exists an inherent conflict of requirements between power component and low-voltage components. Historically this has been resolved by utilizing two physically separate and disparate printed wiring assemblies. However, having a power supply split up into multiple separate boards increases expenses and manufacturing complexity and cost.

SUMMARY

According to one embodiment, a hybrid circuit assembly includes an integrated metal substrate (IMS) having high-voltage, high-power components mounted thereon. The IMS includes a metal base plate an insulating adhesive on the metal base plate, and one or more wiring layers on the insulating adhesive. The hybrid circuit assembly includes a multi-layer printed wiring board (PWB) having low-voltage, low-power components mounted thereon. The multi-layer PWB is connected to the IMS and has an upper surface that is co-planar with an upper surface of the IMS. The PWB is mounted on the metal base plate via the insulating adhesive.

According to another embodiment, a method of manufacturing a hybrid circuit assembly includes attaching a multi-layer printed wiring board (PWB) to an integrated metal substrate (IMS), such that a component-mounting surface of the PWB is co-planar with a component-mounting surface of the IMS.

Additional features are realized through the techniques of the present invention. Other embodiments and aspects of the invention are described in detail herein and are considered a part of the claimed invention. For a better understanding of the invention with the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Conventional power converters require multiple different circuit boards to accommodate high power components and low-power control components. Embodiments of the invention relate to a hybrid circuit board having both a printed wiring board (PWB) and insulated metal substrate (IMS) arranged in a co-planar manner.

Figure 1:
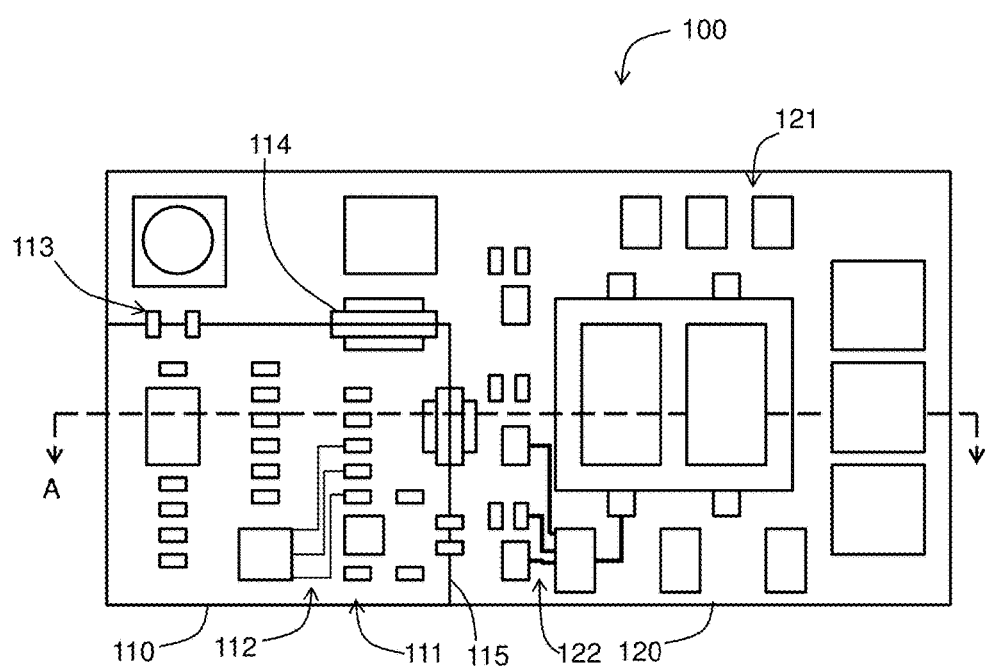
FIG. 1 illustrates an example hybrid circuit assembly according to one embodiment of the invention.

FIG. 1 illustrates a hybrid circuit assembly 100 according to an embodiment of the invention. The hybrid circuit assembly 100 includes a multi-layer printed wiring board (PWB) 110 and an insulated metal substrate (IMS) 120. The terms multi-layer PWB and IMS are given their ordinary meanings in the present specification and claims. In particular, a multi-layer printed wiring board (PWB) is a printed wiring board having conductive traces printed on two or more layers of the wiring board, separated by an insulating material. The two or more layers may include a top layer (shown in FIG. 1) a bottom layer opposite the top layer, and one or more intermediate layers separated from the top layer and bottom layers by an insulator. An insulated metal substrate (IMS) includes a metal base plate, an insulating layer on the metal base plate, and a wiring layer on a surface of the insulating layer opposite the metal baseplate. Unlike an insulated metal substrate, a printed wiring board does not use a metal sheet as a substrate on which to form circuitry.

The multi-layer PWB 110 has electronic components 111 mounted thereon, connected by conductive traces 112. The multi-layer PWB 110 also includes one or more wiring layers inside the multi-layer PWB 110 to conduct electrical signals between components 111. The IMS 120 has components 121 mounted thereon and the components are connected by traces 122.

In embodiments of the invention, the components 121 use higher power levels, or have higher power dissipation, than the components 111. In one embodiment, the components 121 are power-handling components, including large capacitors, inductors, transistors, rectifiers, magnetics, high-power resistors, while the components 111 are low-power components, including low-power resistors and capacitors, logic and analog integrated circuits and processors, small signal transistors and diodes and signal transformers. In one embodiment, the components 121 operate in the range of many hundreds of volts or more and many tens of amperes (Amps) or more, while the components 111 operate in the range of zero (0) to fifteen (15) volts at currents typically less than 1 Amp. In one embodiment, the traces 112 of the multi-layer PWB 110 have a smaller width and space between traces than the traces 122. For example, the higher power-operating levels of the components 121 require larger trace widths and thicknesses and distances between traces to accommodate high voltage, high power transmission.

While only a few traces 112 and 122 are illustrated in FIG. 1, it is understood that each component 111 and 121 may be connected to other components via traces on the respective multi-layer PWB 110 and IMS 120.

The multi-layer PWB 110 and the IMS 120 transmit one or both of power and data signals between themselves via connectors 113 and 114. In one embodiment, the multi-layer PWB 110 includes control circuitry, such as processors and logic, to control the level of power run through the components 121 and output to external devices (not shown in the figures).

In embodiments of the invention, the multi-layer PWB 110 and the IMS 120 are connected along the junction or boundary 115. The multi-layer PWB 110 and the IMS 120 may be connected with an adhesive, with a clamping mechanism, with screws, bolts, welds, solder or any other fixing means. An adhesive or other material that physically joins the multi-layer PWB 110 and IMS 120 to form one assembly 100 may be an insulating material capable of preventing electrical communication between conductive layers of the multi-layer PWB 110 and conductive layers of the IMS 120. In one embodiment, the conductive layers of the multi-layer PWB 110 and the IMS 120 are insulated from each other except by data, power and/or heat connectors, such as the connectors 113 and 114, which are formed to span the junction or boundary 115. In one embodiment, the connectors 113 are components, such as resistors, that span the boundary 115 and electrically connect conductive pads of the multi-layer PWB 110 with pads of the IMS. Connectors 113 can be a multitude of devices including resistors, formed and unformed single and multi-stranded wire, bond wires, any type of metal stock formed and unformed, bond ribbons, transformers, inductors, diodes, transistors, fuses, and other embodiments that conduct electrical current across the PWB 110 to IMS 120 boundary.

Figure 2:
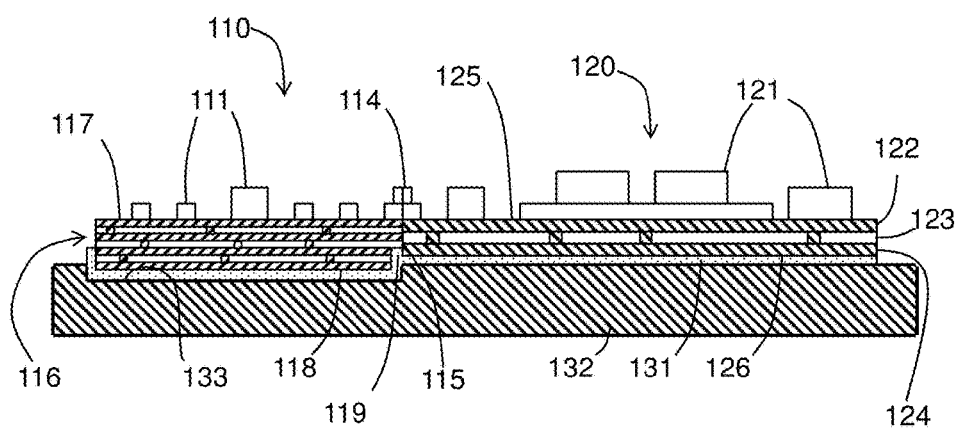
FIG. 2 illustrates a side cross-sectional view of the hybrid circuit assembly according to an embodiment of the invention.

FIG. 2 illustrates a side cross-section view of the hybrid circuit assembly 100 according to an embodiment of the invention. As illustrated in FIG. 2, the multi-layer PWB 110 includes multiple layers 116 stacked one on top of the other. In the example illustrated in FIG. 2, the diagonally-striped layers are wiring layers separated by insulating layers that are illustrate with no stripes. However, embodiments of the invention encompass any number of wiring layers and any configuration of layers. In addition, the wiring layers are connected by conductive vias selectively located to interconnect electrical components 111 in a predetermined manner. In addition, while components 111 are illustrated only on one surface 117 of the multi-layer PWB 110, such components may also be mounted on the opposite surface 118, and in some embodiments, components may be located inside the multi-layer PWB 110.

The IMS includes wiring layers 122 and 124 and an insulating layer 123. The wiring layers 122 and 124 and the insulating layer 123 are mounted on a metal baseplate 132 via an insulating adhesive 131. In some embodiments, the insulating adhesive 131 is an electrically-insulating adhesive that transmits heat to allow the metal base plate 132 to act as a heat sink. In one embodiment, the metal plate layer 124 is separated by conductive layers of the multi-layer PWB 110 by a gap 119. In an alternative embodiment, some wiring of the multi-layer PWB 110 may be connected to the metal plate layer 124. While FIG. 2 illustrates the gap 119 extending only partially up the boundary 115 between the multi-layer PWB 110 and the IMS 120, embodiments of the invention also encompass a gap that extends all the way up the boundary 115, such that the entire multi-layer PWB 110 is separated from the entire IMS 120 by the gap 119, which may be filled by an insulator, as discussed in further detail below.

In embodiments of the invention, the upper surface 125 of the IMS 120 is co-planar with the upper surface 117 of the multi-layer PWB 110. While the term "upper surface 125" is used here with reference to the illustration of FIG. 2, it is understood that the surface 125 may have any orientation. In embodiments of the invention, the surfaces 117 and 125 are defined as surfaces having components 111 and 121 mounted thereon, and the surface 121 is on an opposite side of the IMS 120 from the metal base plate 132. Since the surfaces 117 and 125 are co-planar, components may be mounted on both surfaces 117 and 125 in one manufacturing step.

In one embodiment, the metal base plate 132 includes a recess 133, and the PWB 110 extends at least partially into the recess 133. In other words, the PWB 110 may have a height that is greater than a height of the IMS 120, and may have a lower surface 118 that extends past the lower surface 126 of the IMS 120. While FIG. 2 illustrates the PWB 110 extending into the recess 133, embodiments of the invention also encompass a PWB 110 that does not extend into a recess 133, and embodiments also encompass base plates that have no recess corresponding to a location of the PWB 110.

In embodiments of the invention, the wiring layers and insulating layers of the PWB 110 have a first thickness to accommodate microchips and low-voltage components, the wiring layers and insulating layer of the IMS 120 have a second thickness greater than the first thickness to accommodate high-power components necessary to provide and regulate power, and the thickness of the base plate 132 has a third thickness greater than the first and second thicknesses to act as a substrate on which the IMS 120 may be formed.

In addition, while FIG. 2 illustrates an IMS 120 having multiple wiring layers 122 and 124 separated by an insulating layer 123, embodiments of the invention encompass any number of wiring layers, from one to three or more.

Figure 3:
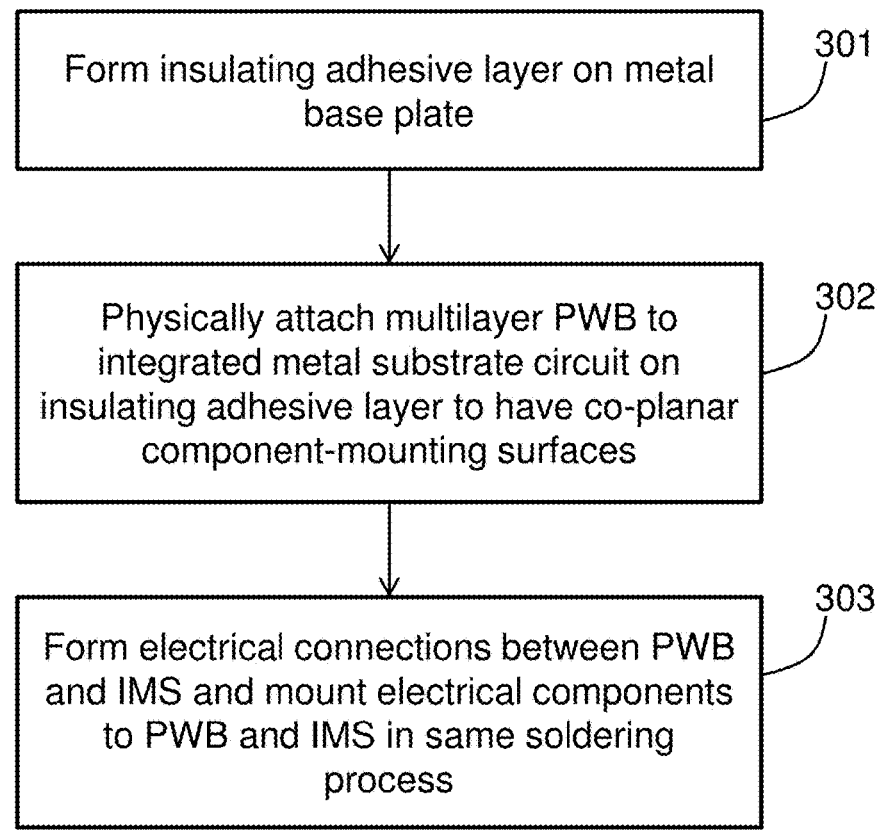
FIG. 3 is a flow diagram of a method of manufacturing a hybrid circuit assembly according to an embodiment of the invention.

FIG. 3 is a flow diagram illustrating a method according to an embodiment of the invention. In block 301, an adhesive insulating layer is formed on a metal base plate of an integrated metal substrate (IMS) assembly. In block 302, a printed wiring board (PWB) and IMS layers are provided on the adhesive insulating layer. In one embodiment, layers of the IMS are formed by deposition, and the PWB is a pre-fabricated PWB that is attached to the adhesive. In another embodiment, the IMS includes pre-fabricated layers that are positioned on the adhesive insulating layer. In embodiments of the invention, the multi-layer PWB and the IMS layers are physically attached to one another in such a manner that their component-mounting surfaces are co-planar.

In block 303, electrical connections are formed between the multi-layer PWB and the IMS. For example, wires, resistors, communications ports or other components and conductors may connect conductive pads from the multi-layer PWB to conductive-pads of the IMS. In addition, electrical components are mounted to each of the multi-layer PWB and the IMS. Since the component-mounting surfaces of each of the multi-layer PWB and the IMS are co-planar, the components may be mounted to both boards in a single soldering step.

Embodiments of the invention relate to a hybrid circuit assembly having one or more multi-layer PWB(s) connected to a single IMS in such a manner that their component-mounting surfaces are co-planar. In some embodiments, the surfaces opposite the component-mounting surfaces are also co-planar. Technical effects includes significant decreases in manufacturing requirements, such as developing stacking structures to stack the two different types of boards one on top of the other.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of manufacturing a hybrid circuit assembly, comprising:
    providing an integrated metal substrate (IMS), the IMS comprising a metal base plate including a recess formed in a first portion of an upper surface of the metal base plate, an insulating layer on a second portion of the upper surface of the metal base plate different from the first portion and adjacent to the recess, and a wiring layer on an upper surface of the insulating layer opposite the metal base plate, the wiring layer including a component mounting surface on a top surface of the wiring layer opposite the metal base plate;
    providing a multi-layer wiring board (PWB), the PWB comprising conductive traces printed on two or more wiring layers separated by insulating material which include a bottom wiring layer with a bottom surface on one side of the PWB and a top wiring layer with a component mounting surface on an opposite side of the PWB;
    attaching the PWB to the IMS within the recess of the metal base plate such that the bottom surface of the bottom wiring layer of the PWB is attached to a top surface of the recess and the component-mounting surface of the top wiring layer of the PWB is co-planar with the component-mounting surface of the wiring layer of the IMS.

2. The method of claim 1, further comprising:
electrically connecting the PWB to the IMS.

3. The method of claim 1, further comprising:
mounting electrical components onto the component-mounting surfaces of the PWB and the IMS in a single manufacturing pass.

4. The method of claim 1, further comprising:
forming the recess of the metal base plate of the IMS to have a shape configured to conform to a shape of the PWB.

5. The method of claim 1, wherein attaching the multi-layer PWB to the IMS includes mounting the multi-layer PWB to the metal base plate of the IMS via an insulating adhesive.

* * * * *